US005455968A

United States Patent [19]
Pham

[11] Patent Number: 5,455,968
[45] Date of Patent: Oct. 3, 1995

[54] VARIABLE POWER AMPLIFIER

[75] Inventor: Chot Pham, Coral Springs, Fla.

[73] Assignee: Motorola, Inc., Schaumburg, Ill.

[21] Appl. No.: 131,229

[22] Filed: Oct. 4, 1993

[51] Int. Cl.$^6$ .............. H04B 1/04; H03G 3/30; H03G 3/10

[52] U.S. Cl. .......... 455/127; 455/126; 330/136; 330/285

[58] Field of Search .............. 455/126, 127, 455/115–117, 249.1; 330/136, 281, 285

[56] References Cited

U.S. PATENT DOCUMENTS

| | | | |
|---|---|---|---|
| 4,462,004 | 7/1984 | Cox et al. | 330/281 |
| 4,553,105 | 11/1985 | Sasaki | 455/249.1 |
| 5,023,569 | 6/1991 | Raven | 330/285 |
| 5,029,298 | 7/1991 | Chiba et al. | 330/285 |
| 5,278,517 | 11/1994 | Fujita | 330/285 |

OTHER PUBLICATIONS

Motorola, Product Review Data Sheet, XRF5015/MRF5015, The RF MOSFET line, Jun. 1993, 2 pages.

*Primary Examiner*—Chi H. Pham
*Assistant Examiner*—Mark D. Wisler
*Attorney, Agent, or Firm*—Pedro P. Hernandez; Daniel K. Nichols

[57] ABSTRACT

A variable power amplifier (100) includes a final stage amplification device (74) which is biased by a bias network (50) which provides for improved stability over a wide operating range and into high output mismatch conditions of greater than 5:1 VSWR.

9 Claims, 2 Drawing Sheets

VARIABLE POWER AMPLIFIER

TECHNICAL FIELD

This invention relates in general to variable power amplifiers, and more specifically to a variable radio frequency (RF) power amplifier providing improved stability.

BACKGROUND

Since a typical metal-oxide semiconductor field-effect transistor (MOSFET) has a gate threshold voltage in the range of 1–6 volts, MOSFETs typically require a gate bias voltage in most design applications. For example, a XRF5015 or MRF5015 MOSFET manufactured by Motorola, Inc. will require a gate voltage of approximately 2.26 volts, producing a drain idle current (IDS) of approximately 100 MA in a typical design. Under these specific bias conditions, the MRF5015 amplifier will exhibit a gain of greater than 10 dB and a drain efficiency of greater than 55% when the MOSFET amplifier is operating in the range of 403 to 470 megahertz (MHz), when used in a radio frequency transmitter design. This very high gain MOSFET is potentially unstable at both very high frequency (VHF) and ultra-high frequency (UHF) designs. A typical approach to enhance the stability of the MOSFET in RF designs is to provide an input loading resistor network between the drain and gate of the MOSFET.

Device S-parameters can be used to calculate and predict the effects of these circuit techniques (input loading and feedback) for achieving stability. For example, measured at VDD=12.5V, quiescent drain current (IDQ)=100 milli-amperes (mA) a MRF5015 amplifier is stable into 5:1 VSWR, over line voltages from 11 volts to 16.6 volts, and operating in a frequency band from 403–470 MHz, at 25° Celsius. However, at −30° Celsius, the power amplifier breaks into oscillations, even into voltage standing wave ratio (VSWR) conditions of as low as 2:1. This instability becomes even worse as output power decreases to under one watt. These cold operating temperature, low power, stability problems are probably due to:

1. The changes in the gate threshold voltage, which is inversely related to temperature. These temperature changes have a larger effect on the IDQ of MOSFETs with high transconductance (gfs) such as the MRF5015 than MOSFETs having low gfs's.
2. Variation in the input and output impedance's of the RF power amplifier with changes in output power levels. Theses variations are even larger with the wider bandwidth matching (403–470 MHZ) and high Q input impedance of devices such as the MRF5015.

As shown from the above discussion, a need exists for a variable power amplifier which can maintain stability under severe output mismatch conditions when operating over a wide operating bandwidth.

DETAILED DESCRIPTION OF THE PREFERRED EMBODIMENT

Figure 1:
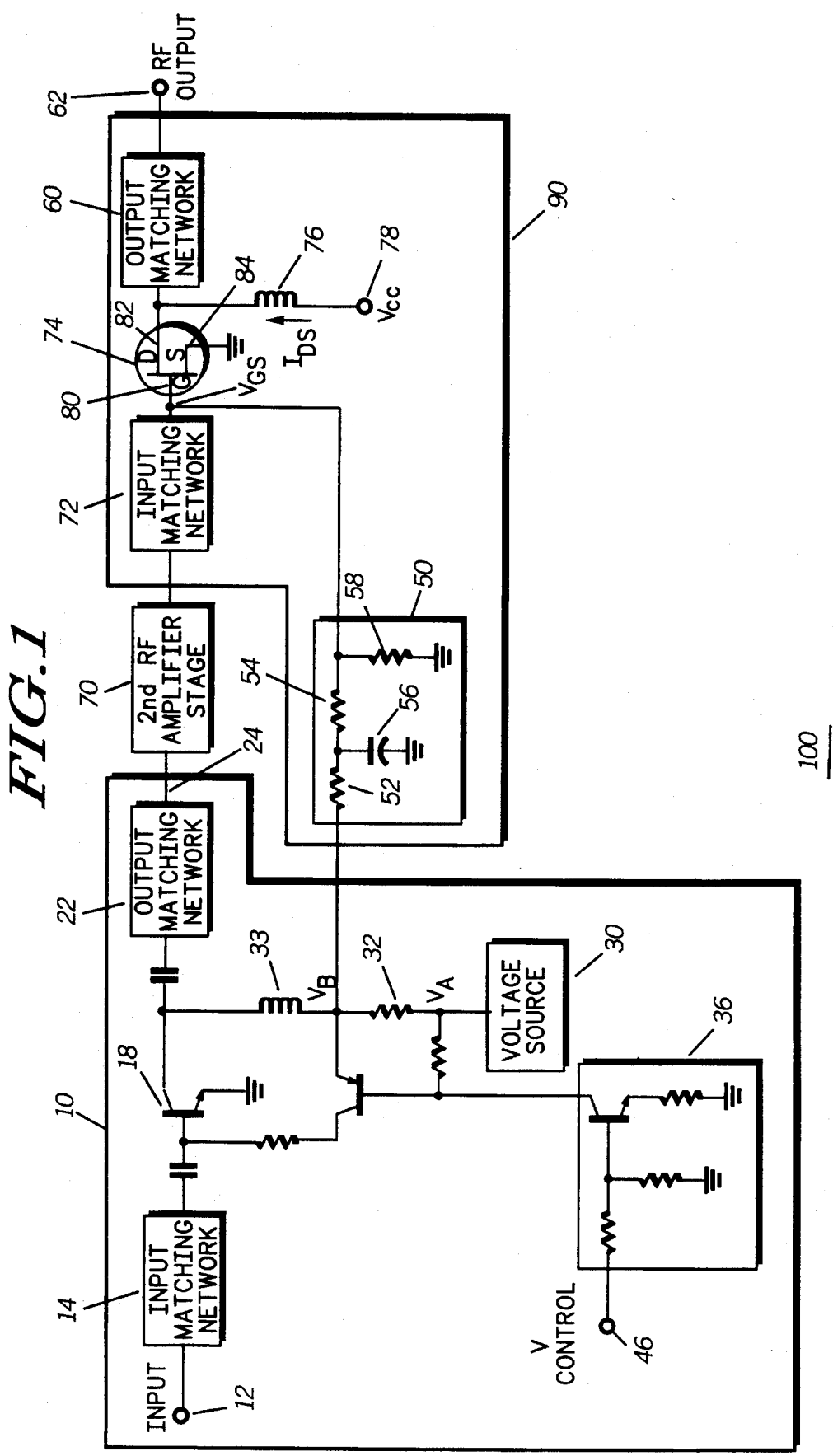
FIG. 1 is a schematic of a variable power amplifier in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a variable radio frequency power amplifier 100 in accordance with the invention is shown. Amplifier 100 includes a first amplifier stage 10 having a RF input port 12. Operationally, a signal to be amplified is received at input port (or RF input port) 12 and presented to a conventional input matching network 14. The signal is amplified by amplification device 18 and sent to a conventional output matching network 22 which provides a first stage output signal 24. Amplification device 18 has its gain controlled by varying the current flowing into the amplification device. The amount of current provided to the amplification device is varied by a variable bias circuit which includes a variable bias network 36 that adapts the input current provided to amplification device 18 in response to a control signal (control voltage) 46. This provides for a first stage with variable gain while avoiding parametric regeneration. The gain of amplification device 18 is controlled by varying the magnitude of its collector current rather than its voltage. Which means that the collector current of device 18 is controlled by the magnitude of control signal or voltage 46. A more detailed explanation of first amplifier stage 10 is found in U.S. Pat. No. 5,023,569, entitled "Variable Gain Amplifier, by Gregory S. Raven, and which is hereby incorporated by reference.

First stage output signal 24 is then sent to a conventional second stage RF amplifier stage 70 as known in the art in order to further amplify input signal 12. The output of second amplifier stage 70 is then sent to a final or third amplifier stage 90. Final amplifier stage 90 which is also known as a RF power amplifier stage includes a conventional input matching network 72. The RF signal is then sent to a final amplification device or RF power amplifier 74. Preferably amplification device 74 is a RF MOSFET such as an MRF5015 N-channel enhancement-mode MOSFET, manufactured by Motorola, Inc. MOSFET 74 includes a first or drain terminal 82, a second or source terminal 84 and a third or gate terminal 80.

A bias network 50 in accordance with the invention provides adaptive biasing for MOSFET 74. Bias network 50 includes first 52 and second 54 resistors in series with a capacitor 56 located at the node between the two resistors coupled to ground potential. Finally, a third resistor is coupled between second resistor 54 and ground potential. Source terminal 84 of MOSFET 74 is coupled to ground potential. Completing the final amplification stage is an inductor 76 coupled between the drain terminal of MOSFET 74 and supply voltage (Vcc) 78 which act as a current source for MOSFET 74. In accordance with the preferred embodiment, Vcc is set at approximately 13.8 volts. The RF signal amplified by MOSFET 74 is then fed to a final output matching network 60 the purpose for and design of which are well known in the art. Output network provides the signal at an output port 62 which is usually coupled to an antenna (not shown) for transmission of the RF signal.

Operationally, when the output power of amplifier 100 is decreasing, control voltage 46 is also decreasing, the collector current of amplification device 18 is also decreasing. In turn node voltage $V_B$ is increasing and therefore both the bias voltage at node $V_{GS}$ as well as the idle drain current $I_{DS}$ of MOSFET 74 are also increasing. This is due to bias network 50 receiving the voltage from node VB and providing a bias voltage to gate terminal 80. When the output power of amplifier 100 is increasing however, control voltage 46 is increasing, collector current of amplification device 18 is also increasing, node voltage $V_B$ is decreasing, causing both node voltage $V_{GS}$ and the idle drain current $I_{DS}$ of MOSFET 74 to be decreasing. The biasing of MOSFET 74 in accordance with the invention provides for the final bias voltage VGS and idle current IDS to both be inversely or negatively related to the output power provided by MOSFET 74. That is, the bias network of final stage 90 operates so that both the bias voltage $V_{GS}$ and idle current $I_{DS}$ provided to amplification device 74 decrease with increasing power ouput by amplification device 74, and both increase in level with decreasing power output.

The biasing scheme of the present invention allows for MOSFET 74 to operate more efficiently under severe mismatched load conditions at high output power levels where the efficiency of MOSFET 74 is critical. At very low power conditions, where the power dissipation of MOSFET 74 is not critical, the higher bias voltage $V_{GS}$ and higher idle current $I_{DS}$ of MOSFET 74 minimize the device's input and output impedance variations. These impedance variations being worse at the operational frequency band edges due to the wide bandwidth of amplifier 100 and the high input Q of MOSFET 74. The higher VGS bias voltage also negates the changes in the gate threshold voltage which are inversely related to the operating temperature of MOSFET 74.

The present biasing scheme provides for improved operational stability of power amplifier 74 over a wide operating bandwidth of 403 to 470 MHz. Providing improved stability over wide temperature and wide power output ranges of 1 to 11 watts into mismatches of greater than 5:1 VSWR. A typical set of operational values are shown in table 1. These values were achieved with resistor 32 having a value of 17 ohms, resistors 52, 54 and 58 having a value of 4.7 kilo-ohms, capacitor 56 having a value of 0.01 uF, voltage source 30 having a value of 9.1 volts and a supply voltage Vcc of approximately 13.8 volts.

TABLE 1

| $V_{control}$ (volts) | $V_B$ (Volts) | $V_{GS}$ (Volts) | $I_{DS}$ (Amperes) |
|---|---|---|---|
| 0 | 9.10 | 3.06 | 1.08 |
| 3 | 9.10 | 3.06 | 1.08 |
| 4 | 9.02 | 3.02 | 1.05 |
| 5 | 8.82 | 2.96 | 0.96 |
| 6 | 8.56 | 2.88 | 0.85 |
| 7 | 8.34 | 2.81 | 0.77 |
| 8 | 8.11 | 2.74 | 0.68 |
| 9 | 7.93 | 2.66 | 0.60 |
| 10 | 7.67 | 2.58 | 0.50 |
| 11 | 7.50 | 2.52 | 0.44 |

Figure 2:
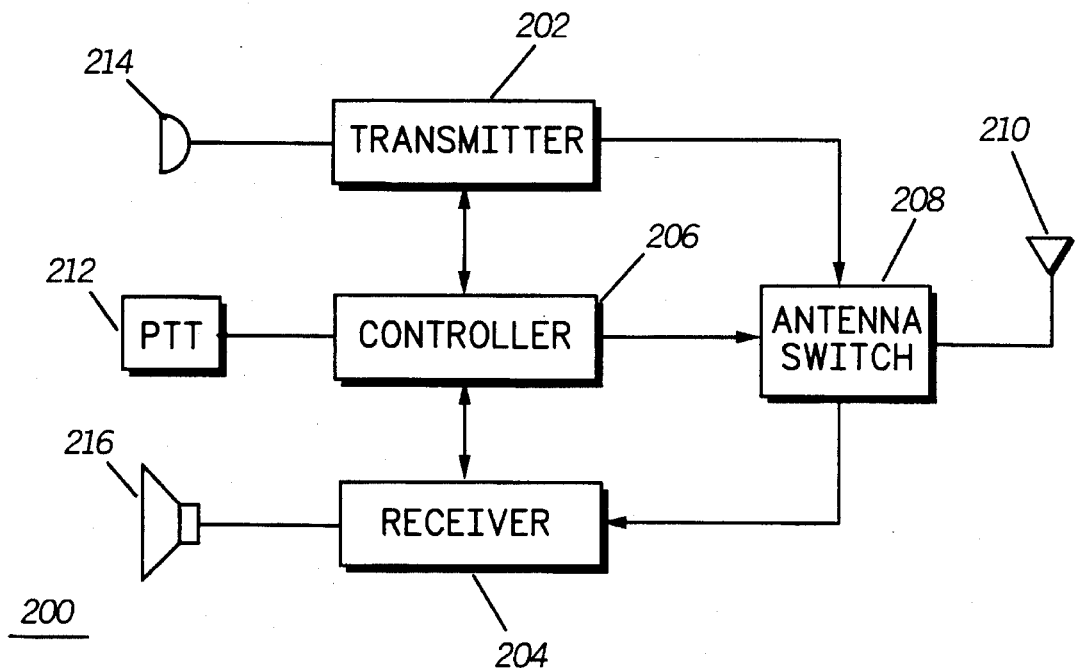
FIG. 2 is a schematic of a radio in accordance with the invention.

In FIG. 2, a simplified block diagram of a radio 200 utilizing the present invention is shown. Radio 200 includes a RF transmitter section 202 having an RF amplifier as shown in FIG. 1. Coupled to transmitter 202 is a microphone which converts voice signals into electrical signals which can be used by transmitter 202. Radio 200 also includes a receiver section 204 of conventional design. A speaker 216 is coupled to receiver 204 for the presentation of audio signals. Transmitter 202 and receiver 204 are switchably coupled to antenna 210 via antenna switch 208. A controller such as a microprocessor 206 having appropriate control software controls the operations of radio 200. Finally, a push-to-talk (PTT) switch 212 is coupled to controller 206 in order to activate transmitter 202.

Figure 3:
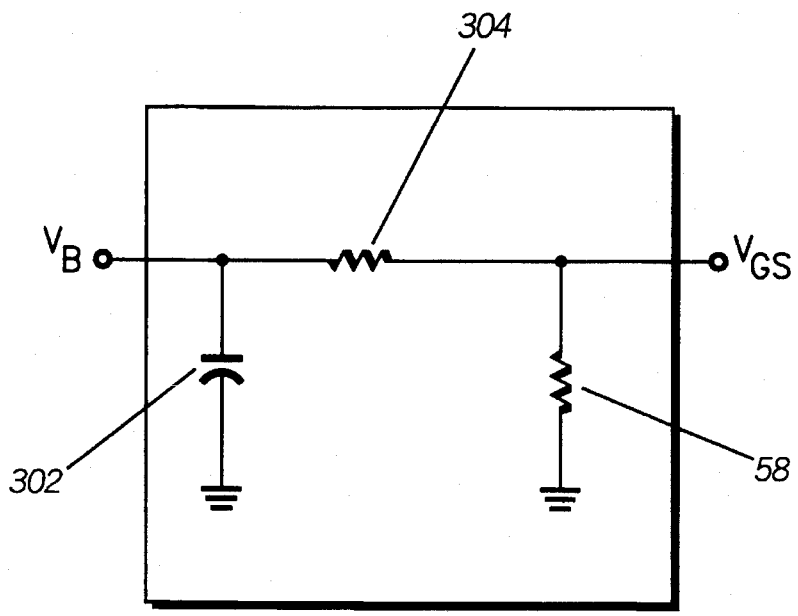
FIG. 3 is an alternate bias network for a power amplifier in accordance with the invention.

An alternative embodiment of bias network 50 in FIG. 1 is shown in FIG. 3. Bias network 300 includes a single capacitor 302 coupled to ground potential and a series resistor 304. Resistor 58 of FIG. 1 is coupled between the other side of resistor 304 and ground potential. Preferably, a plating inductor or a diode (not shown) should also be between node $V_B$ and the junction of capacitor 302 and resistor 304. In the particular example referred to above in association with FIG. 1, resistor 304 would have a value of 10 kilo-ohms and resistor 58 would be changed to 3 kilo-ohms.

While the preferred embodiment of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A variable power amplifier for providing a variable level output signal, comprising:
   a first amplifier stage:
   a variable bias circuit coupled to the first amplifier stage for controlling the gain of the first amplifier stage:
   a final amplifier stage operatively coupled to the first amplifier stage, the final amplifier stage providing the variable level output signal; and
   a bias network coupled to the variable bias circuit for providing a bias voltage to the final amplifier stage for causing an idle current of the final amplifier stage to be inversely related to the variable level output signal of the variable power amplifier.

2. A variable level power amplifier as defined in claim 1, wherein the final amplifier stage comprises a MOSFET having drain source and gate terminals and the bias network supplies the bias voltage to the gate terminal of the MOSFET.

3. A variable power amplifier as defined in claim 2, wherein the variable biasing circuit has an input terminal for receiving a control signal and provides an input voltage level to the bias network in response to the control signal.

4. A variable level power amplifier as defined in claim 2, wherein the MOSFET is an N-channel enhancement mode device.

5. A variable level power amplifier as defined in claim 3, wherein the control signal received by the variable biasing circuit is a variable voltage level and the input voltage level that the variable biasing circuit provides to the bias network is inversely related to the voltage level of the control signal.

6. A radio, comprising:
   a receiver; and
   a transmitter coupled to the receiver, the transmitter including:
      a variable power amplifier for providing a variable level output signal, comprising:
      a first amplifier stage:
      a variable bias circuit coupled to the first amplifier stage for controlling the gain of the first amplifier stage:
      a final amplifier stage comprising a MOSFET having drain, source and gate terminals, the final amplifier stage being operatively coupled to the first amplifier stage and providing the variable level output signal; and a bias network coupled to the variable bias circuit providing a bias voltage to the MOSFET's gate terminal, the bias network causing the bias voltage provided to the MOSFET's gate terminal and an idle drain current of the MOSFET to be inversely related to the variable level of the output signal provided by the variable power amplifier.

7. A radio as defined in claim 6, further wherein the variable biasing circuit has an input terminal for receiving a control signal and provides an input voltage level to the bias network in response to the control signal.

8. A radio as defined in claim 7, wherein the MOSFET is an N-channel enhancement mode device.

9. A radio as defined in claim 7, wherein the control signal received by the variable biasing circuit is a variable voltage level and the input voltage level that the variable biasing circuit provides to the bias network is inversely related to the voltage level of the control signal.

* * * * *